(12) United States Patent
Mo

(10) Patent No.: US 7,482,842 B2
(45) Date of Patent: Jan. 27, 2009

(54) RADIATION HARDENED PHASE FREQUENCY DETECTOR FOR IMPLEMENTING ENHANCED RADIATION IMMUNITY PERFORMANCE

(75) Inventor: William Yeh-Yung Mo, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/532,301

(22) Filed: Sep. 15, 2006

(65) Prior Publication Data

US 2008/0068044 A1 Mar. 20, 2008

(51) Int. Cl.
*G01R 25/00* (2006.01)
*H03D 13/00* (2006.01)
(52) U.S. Cl. .................................. 327/5; 327/3; 327/12
(58) Field of Classification Search ..................... 327/3, 327/5
See application file for complete search history.

(56) References Cited

U.S. PATENT DOCUMENTS

| 6,218,868 B1 * | 4/2001 | Katoh ........................ 327/12 |
| 6,285,219 B1 | 9/2001 | Pauls |
| 6,771,096 B1 | 8/2004 | Meyers et al. |
| 7,038,497 B2 * | 5/2006 | Meltzer et al. ................ 327/47 |
| 7,327,197 B2 | 2/2008 | Kriz |
| 2002/0011983 A1 * | 1/2002 | Yamazaki et al. ............. 345/92 |
| 2002/0118006 A1 | 8/2002 | Enam et al. |
| 2003/0030474 A1 | 2/2003 | McGowen |
| 2007/0164800 A1 * | 7/2007 | Josephson .................... 327/158 |

* cited by examiner

*Primary Examiner*—Kenneth B. Wells
*Assistant Examiner*—Ryan C Jager
(74) *Attorney, Agent, or Firm*—Joan Pennington

(57) ABSTRACT

A radiation hardened phase frequency detector (PFD) is provided for implementing enhanced radiation immunity performance. The radiation hardened phase frequency detector (PFD) includes a plurality of functional blocks. Each functional block includes duplicated components providing duplicated inputs, internal nodes and outputs. The duplicated components are arranged so that when there is a SEU hit to one node and the duplicated node supports the functionalities of the PFD.

9 Claims, 8 Drawing Sheets

RADIATION HARDENED PHASE FREQUENCY DETECTOR FOR IMPLEMENTING ENHANCED RADIATION IMMUNITY PERFORMANCE

FIELD OF THE INVENTION

The present invention relates generally to the data processing field, and more particularly, relates to a method and radiation hardened phase frequency detector (PFD) for implementing enhanced radiation immunity performance.

DESCRIPTION OF THE RELATED ART

A need exists for a phase frequency detector capable of avoiding single event upsets and maintaining functionality while running at frequency equal to or higher than GHz ranges.

CMOS circuits used in space applications are subject to a single event upset (SEU) due to the hit of Alpha particles or neutron induced radiation effects. For example, the free charge produced by impacts from incident radiation could be as high as 1 pC (pico-Coulomb) that can have 2 mA (milliampere) amplitude with 1 ns (nano-second) period.

While a phase frequency detector is running at frequency lower than 200 Mhz, a radiation hit with 1 pC charge may not always cause soft error if the current pulse width of the radiation hit does not fall into the critical timing window of the set and hold times of any of the latches in the PFD. However, fabricated in deep submicron technology, a PFD can run up to or higher than GHz range. In this case, the vulnerable timing window of set-up and hold time of latches defining the PFD are always covered under the 1 ns or longer period of a hit.

SUMMARY OF THE INVENTION

A principal aspect of the present invention is to provide radiation hardened phase frequency detector (PFD) for implementing enhanced radiation immunity performance or radiation hardening. Other important aspects of the present invention are to provide such method and radiation hardened phase frequency detector (PFD) substantially without negative effect and that overcome many of the disadvantages of prior art arrangements.

In brief, radiation hardened phase frequency detector (PFD) are provided for implementing enhanced radiation immunity performance. The radiation hardened phase frequency detector (PFD) includes a plurality of functional blocks. Each functional block includes duplicated components providing duplicated inputs, duplicated internal nodes and duplicated outputs. The duplicated components are arranged so that when there is a single event upset (SEU) hit to one node, an associated duplicated node for the one node supports the functionalities of the PFD to mitigate the attack of the single event upset.

In accordance with features of the invention, at the top level of the PFD, the duplicated inputs and outputs are generated so that the mitigation can be expanded to a higher level of inputs and outputs, if needed. The radiation hardened phase frequency detector (PFD) enables an operating frequency range of greater than or equal to 1 GHz.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, a phase frequency detector (PFD) is mitigated to survive the attack of a single event upset (SEU), for example, due to the hit of Alpha particles or neutron induced radiation effects, providing radiation hardened PFDs of the preferred embodiments that function properly. Redundant components of the PFD are used to mitigate the functional blocks. Hence, the basic building blocks including latches, and combinational gates are made of duplicated components, such that when there is a hit to one node, the duplicated node supports the functionalities of the PFD. Additionally, at the top level of the PFD, duplicated inputs and outputs are generated so that the mitigation can be expanded to other higher levels when needed.

Figure 1:
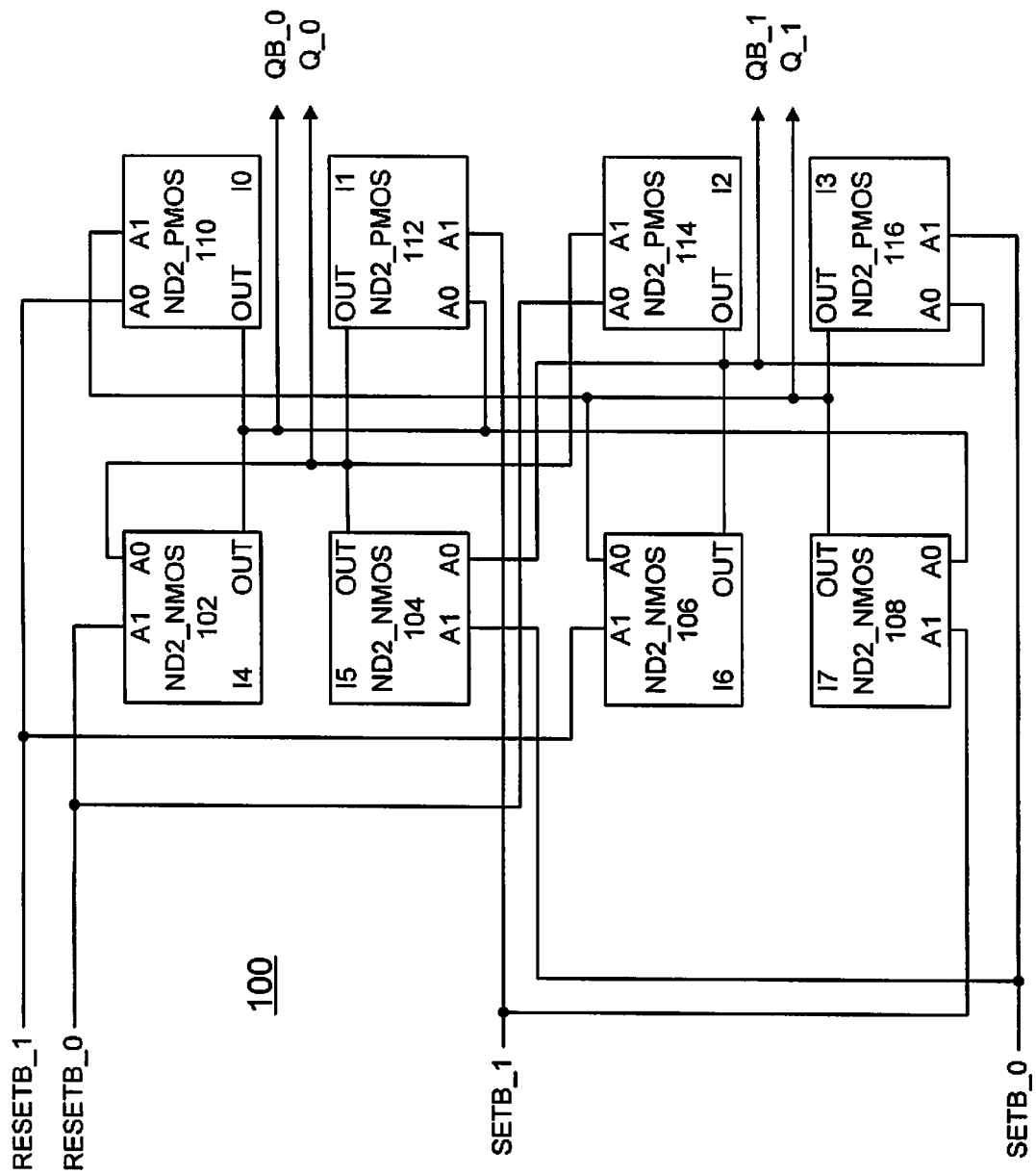
FIG. 1 is a block diagram of an exemplary radiation hardened two input reset set latch, RH_RS_LAT_ND2 implemented in accordance with a method of the preferred embodiment.

Having reference now to the drawings, in FIG. 1, there is shown an exemplary two input latch generally designated by the reference character 100 in accordance with the preferred embodiment. The two input latch 100 is a radiation hardened reset set (RS) latch. The two input latch 100 includes RESETB_0, RESETB_1 and SETB_0, SETB_1, which are two pairs of duplicated inputs. The two input latch 100 includes QB_0, Q_0, and QB_1, Q_1, which are two pairs of duplicated outputs. The two input latch 100 includes two pairs of two input NAND NMOS pull down gates, ND2_NMOS, 102, 104; and 106, 108 and two pairs of two input NAND PMOS pull up gates, ND2_PMOS, 110, 112; and 114, 116.

As shown in FIG. 1, input RESETB_0 is applied to an A1 input of two input NAND NMOS pull down gate ND2_NMOS, 102 and A0 input of two input NAND PMOS pull up gates, ND2_PMOS, 114. Input RESETB_1 is applied to an A1 input of two input NAND NMOS pull down gate ND2_NMOS, 106 and to an A0 input of two input NAND PMOS pull up gates, ND2_PMOS, 110. Input SETB_0 is applied to an A1 input of two input NAND NMOS pull down gate ND2_NMOS, 104 and to an A1 input of two input NAND PMOS pull up gates, ND2_PMOS, 116. Input SETB_1 is applied to an A1 input of two input NAND NMOS pull down gate ND2_NMOS, 108 and to an A1 input of two input NAND PMOS pull up gates, ND2_PMOS, 112.

As shown in FIG. 1, the A0 input of two input NAND NMOS pull down gate ND2_NMOS, 108 and the A0 input of two input NAND PMOS pull up gate ND2_PMOS, 112 and the output of two input NAND NMOS pull down gate ND2_NMOS, 102 are connected to the output of two input NAND PMOS pull up gate ND2_PMOS, 110 at latch output QB_0. The A0 input of two input NAND NMOS pull down gate ND2_NMOS, 102 and the A1 input of two input NAND PMOS pull up gate ND2_PMOS, 114 and the output of two input NAND NMOS pull down gate ND2_NMOS, 104 are connected to the output of two input NAND PMOS pull up gate ND2_PMOS, 112 at latch output Q_0. The A0 input of two input NAND NMOS pull down gate ND2_NMOS, 104 and the A0 input of two input NAND PMOS pull up gate ND2_PMOS, 116 and the output of two input NAND NMOS pull down gate ND2_NMOS, 106 are connected to the output of two input NAND PMOS pull up gate ND2_PMOS, 114 at latch output QB_1. The A0 input of two input NAND NMOS pull down gate ND2_NMOS, 106 and the A1 input of two input NAND PMOS pull up gate ND2_PMOS, 110 and the output of two input NAND NMOS pull down gate ND2_NMOS, 108 are connected to the output of two input NAND PMOS pull up gate ND2_PMOS, 116 at latch output Q_1.

Figure 2:
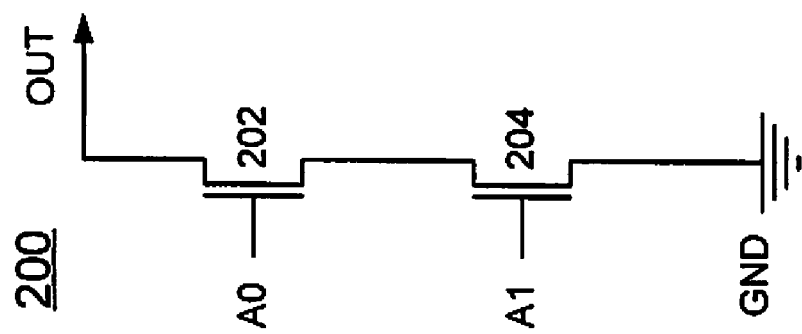
FIG. 2 is a schematic diagram of an exemplary two input NAND NMOS pull down gate, ND2_NMOS of the latch of FIG. 1 implemented in accordance with a method of the preferred embodiment.

Referring now to FIG. 2, there is shown an exemplary two input NAND NMOS pull down gate generally designated by the reference character 200 in accordance with the preferred embodiment. The two input NAND NMOS pull down gate 200 advantageously implements the two pairs of two input NAND NMOS pull down gates, ND2_NMOS, 102, 104; and 106, 108 of the RS latch 100 of FIG. 1. The two input NAND NMOS pull down gate 200 includes a pair of series connected N-channel field effect transistors (NFETs) 202, 204 connected between the output node OUT and ground.

Input A0 is applied to the gate of NFET 202 and input A1 is applied to the gate of NFET 204.

Figure 3:
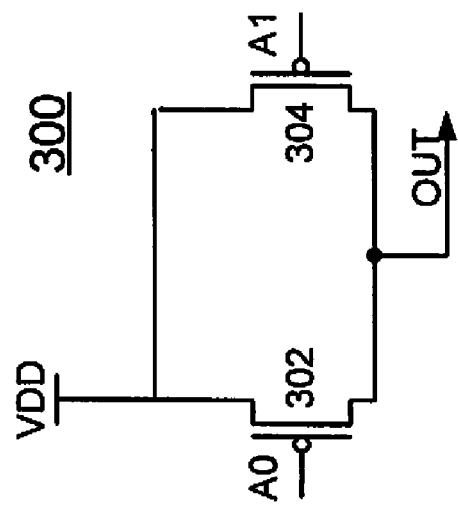
FIG. 3 is a schematic diagram of an exemplary two input NAND PMOS pull up gate, ND2_PMOS of the latch of FIG. 1 implemented in accordance with a method of the preferred embodiment.

Referring now to FIG. 3, there is shown an exemplary two input NAND PMOS pull up gate generally designated by the reference character 300 in accordance with the preferred embodiment. The two input NAND PMOS pull up gate 300 advantageously implements the two pairs of two input NAND PMOS pull up gates, ND2_PMOS, 110, 112; and 114, 116 of the RS latch 100 of FIG. 1. The two input NAND PMOS pull up gate 300 includes a pair of parallel connected P-channel field effect transistors (PFETs) 302, 304 connected between a voltage supply rail VDD and the output node OUT. Input A0 is applied to the gate of PFET 302 and input A1 is applied to the gate of PFET 304.

Operation of the radiation hardened RS latch may be understood from the following two cases that are used to describe how the mitigations work. In case 1, there is a hit to one of the outputs; when all inputs RESETB_1, RESETB_0, SETB_1, SETB_0 and the outputs Q_0, Q_1 are high and the outputs QB_0, QB_1 are low. Consider that there is a hit to the output Q_1 node to pull the Q_1 node to low with a negative current pulse, QB_1 is still low since the inputs of two input NAND PMOS pull up gates, ND2_PMOS, 114 A0, A1 stay high, as shown in FIG. 3.

In case 2, there is a hit to one of the inputs including the same input and output conditions as of case 1 or with all inputs RESETB_1, RESETB_0, SETB_1, SETB_0 and the outputs Q_0, Q_1 are high and the outputs QB_0, QB_1 are low. If a hit is to strike the output of a gate which drives to RESETB_0 and to pull it to low, then the transistor PFET 302 of FIG. 3 of NAND PMOS pull up gates, ND2_PMOS, 114 is turned on to oppose or fight with the NFETs 202, 204 of FIG. 2 of two input NAND NMOS pull down gates, ND2_NMOS, 106. Hence, QB_1 could drift higher than ground voltage due to the fighting and potentially to fully turn on NFET 202 of FIG. 2 of two input NAND NMOS pull down gates, ND2_NMOS, 104. However, the PN ratio of ND2_PMOS, 114 to ND2_NMOS, 106 is designed such that the node voltage of QB_1 is kept low enough so that Q_0 stays high.

Hence, the states of the latch outputs will not change when there is a hit to one of the latch inputs or latch outputs. Additionally, there are cases when a hit to pull a node to high from low; a similar examination can be applied to show that the radiation hardened latch 100 is also mitigated by design such that all outputs will not change when there is a hit.

Figure 4:
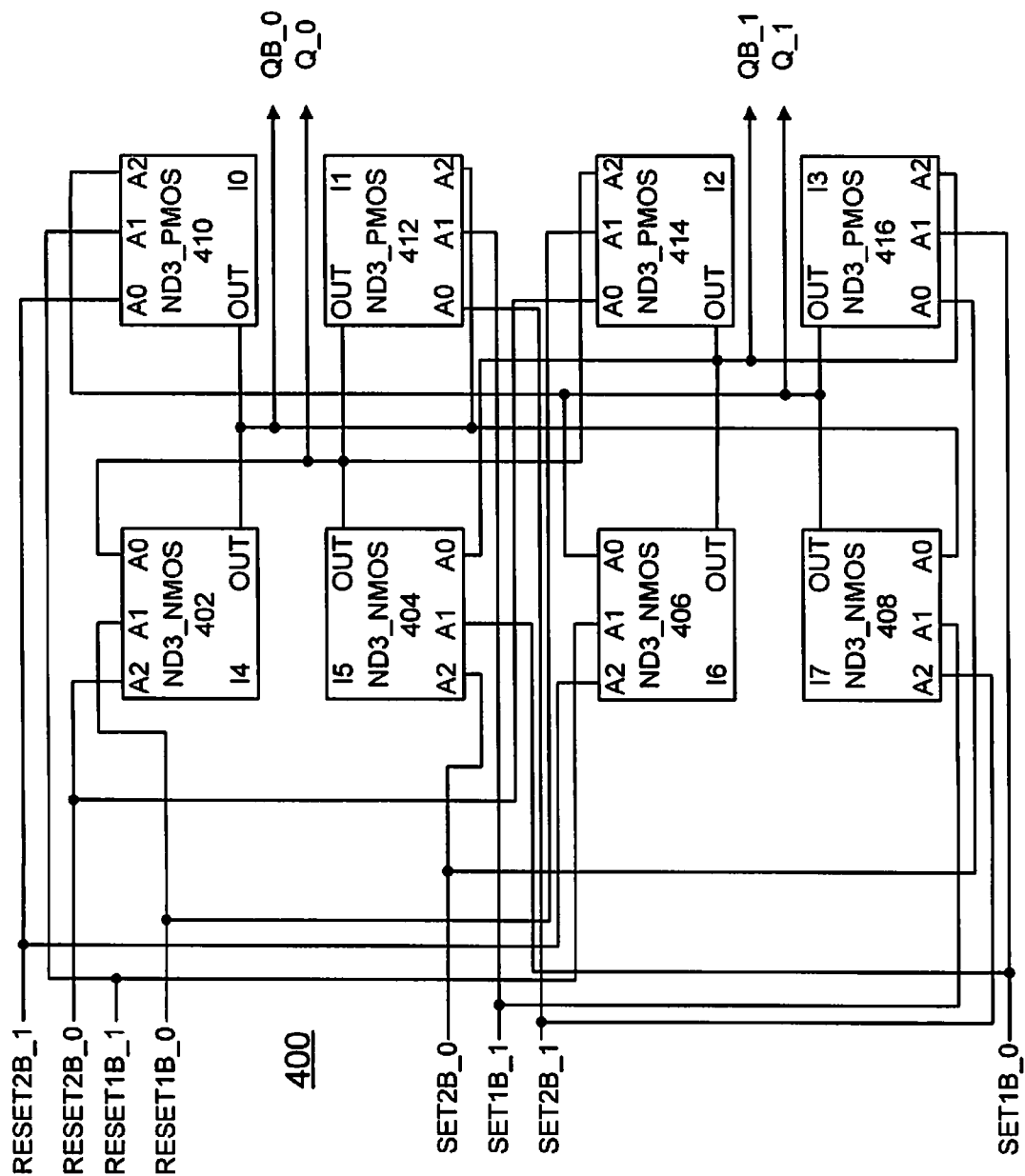
FIG. 4 is a block diagram of an exemplary radiation hardened three input reset set latch, RH_RS_LAT_ND3 implemented in accordance with a method of the preferred embodiment.

Referring now to FIG. 4, there is shown an exemplary three input radiation hardened latch generally designated by the reference character 400 implemented in accordance with a method of the preferred embodiment. The three input latch 400 includes RESET1B_0, RESET1B_1; RESET2B_0, RESET2B_1; SET2B_0, SET2B_0 and SET1B_0, SET1B_0, which are four pairs of duplicated inputs. The three input latch 400 includes QB_0, Q_0, and QB_1, Q_1, which are two pairs of duplicated outputs. The three input latch 400 includes two pairs of three input NAND NMOS pull down gates, ND3_NMOS, 402, 404; and 406, 408 and two pairs of three input NAND PMOS pull up gates, ND3_PMOS, 410, 412; and 414, 416. The three input latch 400 is radiation hardened including the same mitigation mechanism as the RS latch 100 with 2-input which means that as long as only one of the inputs or outputs is pulling up from ground or down from VDD by a current pulse, the outputs are maintained or stay put. The three input latch 400 is a radiation hardened reset set (RS) latch.

Figure 5:
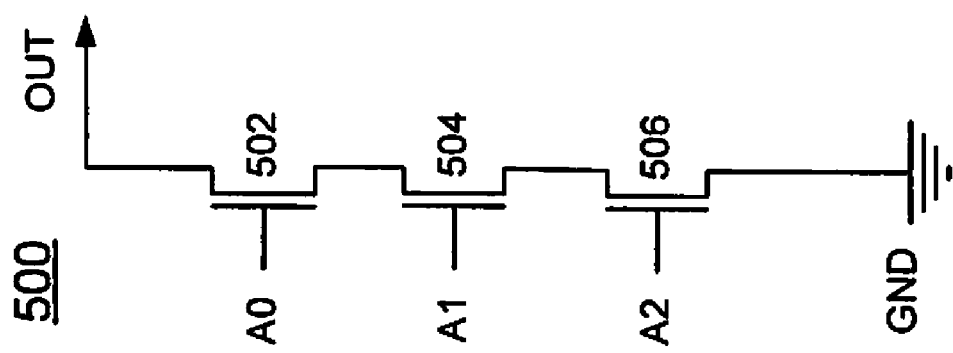
FIG. 5 is a schematic diagram of an exemplary three input NAND NMOS pull down gate, ND3_NMOS of the latch of FIG. 4 implemented in accordance with a method of the preferred embodiment.

Referring now to FIG. 5, there is shown an exemplary three input NAND NMOS pull down gate generally designated by the reference character 500 in accordance with the preferred embodiment. The three input NAND NMOS pull down gate 500 advantageously implements the two pairs of three input NAND NMOS pull down gates, ND3_NMOS, 402, 404; and 406, 408 of the RS latch 400 of FIG. 4. The three input NAND NMOS pull down gate 500 includes three series connected N-channel field effect transistors (NFETs) 502, 504, 506 connected between the output node OUT and ground. Input A0 is applied to the gate of NFET 502; input A1 is applied to the gate of NFET 504; and input A2 is applied to the gate of NFET 506.

Figure 6:
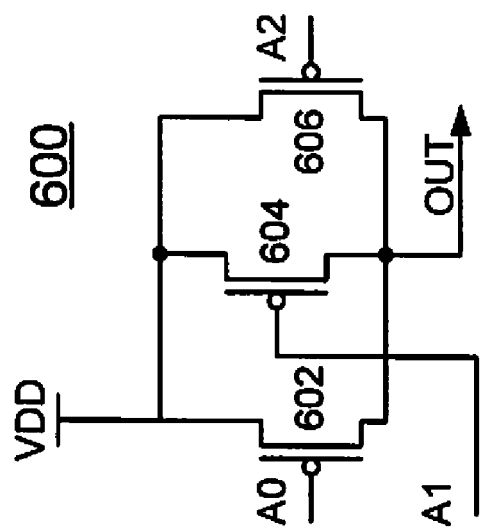
FIG. 6 is a schematic diagram of an exemplary three input NAND PMOS pull up gate, ND3_PMOS of the latch of FIG. 4 implemented in accordance with a method of the preferred embodiment.

Referring now to FIG. 6, there is shown an exemplary three input NAND PMOS pull up gate generally designated by the reference character 600 in accordance with the preferred embodiment. The three input NAND PMOS pull up gate 600 advantageously implements the two pairs of three input NAND PMOS pull up gates, ND3_PMOS, 410, 412; and 414, 416 of the RS latch 400 of FIG. 4. The three input NAND PMOS pull up gate 600 includes three parallel connected P-channel field effect transistors (PFETs) 602, 604, 606 connected between a voltage supply rail VDD and the output node OUT. Input A0 is applied to the gate of PFET 602; input A1 is applied to the gate of PFET 604; and input A2 is applied to the gate of PFET 606.

Figure 7:
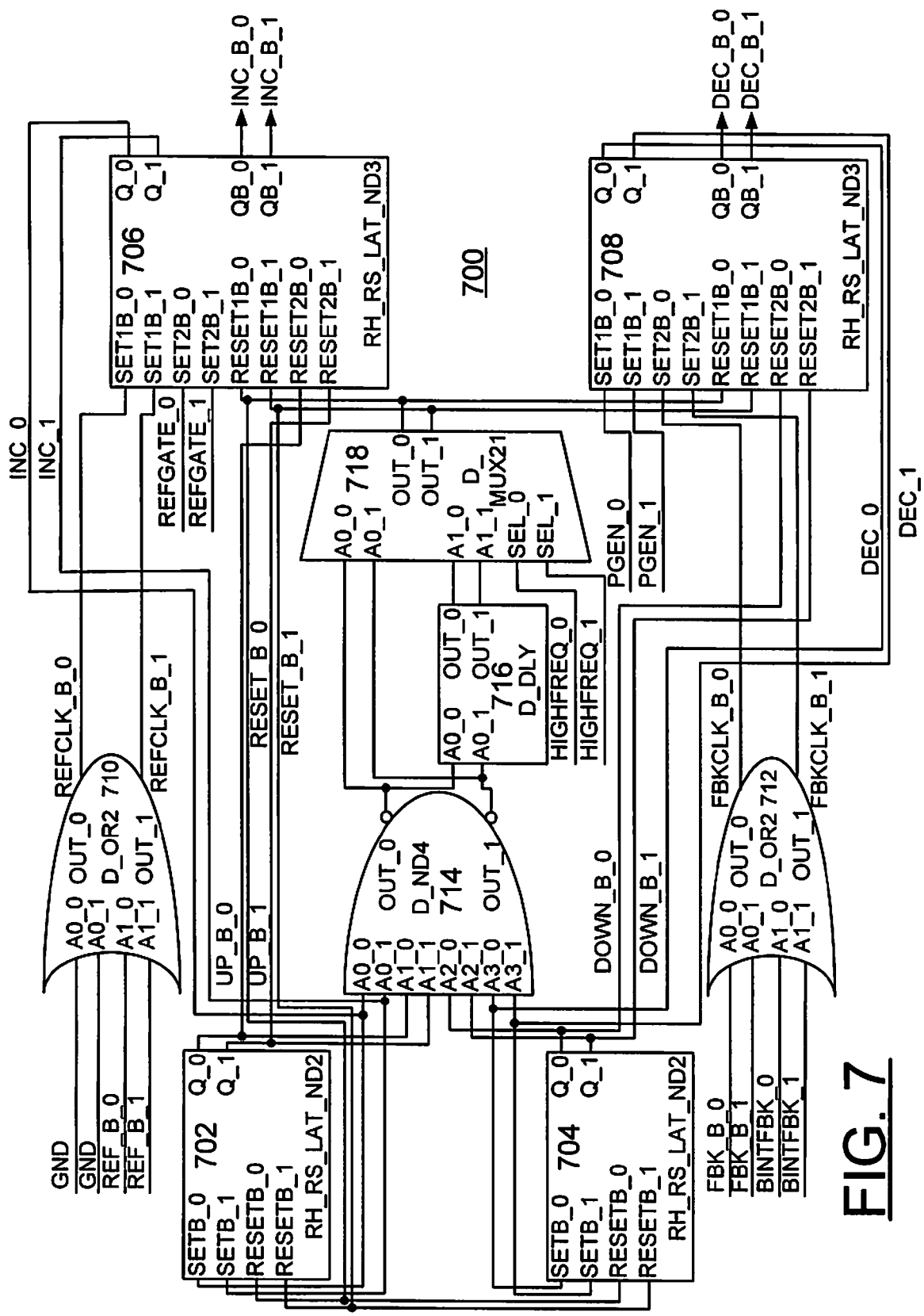
FIG. 7 is a block diagram of an exemplary radiation hardened phase frequency detector (PFD) implemented in accordance with a method of the preferred embodiment.

Referring now to FIG. 7, there is shown an exemplary radiation hardened phase frequency detector (PFD) generally designated by the reference character 700 implemented in accordance with a method of the preferred embodiment. The radiation hardened phase frequency detector (PFD) includes a pair of 2-input radiation hardened latches 702, 704 and a pair of 3-input radiation hardened latches 706, 708 together with logic gates including a pair of dual OR gates 710, 712, a dual NAND gates 714, a dual delay lines 716, and a dual multiplexer 718. As shown in FIG. 7, the PFD is a radiation hardened phase frequency detector, since each of the latches 702, 704, 706, 708 is radiation hardened having duplicated inputs and outputs. For example, latches 702, 704 are implemented with radiation hardened latches 100 of FIG. 1 and latches 706, 706 are implemented with radiation hardened latches 400 of FIG. 4.

As further illustrated in more detail and described with respect to FIGS. 8, 9, 10 and 11, each of the logic gates including dual OR gates 710, 712, dual NAND gate 714, dual delay lines 716, and dual multiplexers 718 also must be implemented by duplicated gates. In the illustrated radiation hardened PFD 700, each of the inputs and outputs are duplicated so that the duplication can be expanded to higher level if required for a particular application. However, only one of the duplicated inputs or outputs can also be implemented by tying the unused input of a pair to high and leave the un-used output of a pair open.

As shown in the illustrated radiation hardened PFD 700, REF_B_0, REF_B_1 inputs to dual OR gate 710 are the reference clocks; FBK_B_0, FBK_B_1 inputs to dual OR gate 712 are the feedback clocks; and PGEN_0, PGEN_1 are the feedback divider outputs. BINTFBK_0, BINTFBK_1 inputs to dual OR gate 712 are low if an external feedback path is used. HIGHFREQ_0, HIGHFREQ_1 are high during normal operation bypassing the dual delay lines 716 in the reset path to the radiation hardened 3-input latches 706, 708. Duplicate outputs of the radiation hardened 3-input latches 706, 708, INC_B_0, INC_B_1 and DEC_B_0, DEC_B_1 are the main outputs. When there is a SEU hit, since the hit is either to pull up or down of one and only one node in the radiation hardened PFD 700, the outputs of the radiation hardened 3-input latches 706, 708 and the outputs of the radiation hardened 2-input latches 702, 704 will not be changed so that the outputs of the radiation hardened PFD 700 are maintained or stay put with a SEU hit.

Figure 8:
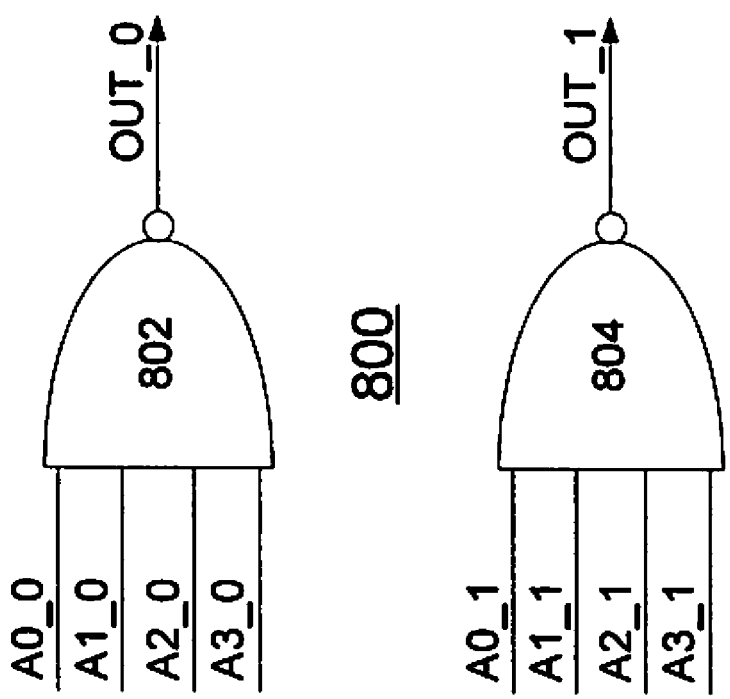
FIG. 8 is a schematic diagram of dual NAND logic gate, D_ND4 each having duplicated inputs and duplicated outputs, of the exemplary radiation hardened phase frequency detector (PFD) of FIG. 7 implemented in accordance with a method of the preferred embodiment.

Referring now to FIG. 8, there are shown dual NAND logic gates generally designated by the reference character 800 implemented in accordance with a method of the preferred embodiment. A pair of NAND logic gates 802, 804 of the dual NAND logic gates 800 has duplicated inputs and outputs; there is an example of implementing dual NAND gates 714 of the exemplary radiation hardened phase frequency detector (PFD) 700. Inputs A0_0, A1_0, A2_0, A3_0 are applied to NAND logic gate 802 and duplicated inputs A0_1, A1_1, A2_1, A3_1 are applied to NAND logic gate 804. NAND logic gate 802 provides output OUT_0 and NAND logic gate 804 provides duplicated output OUT_1.

Figure 9:
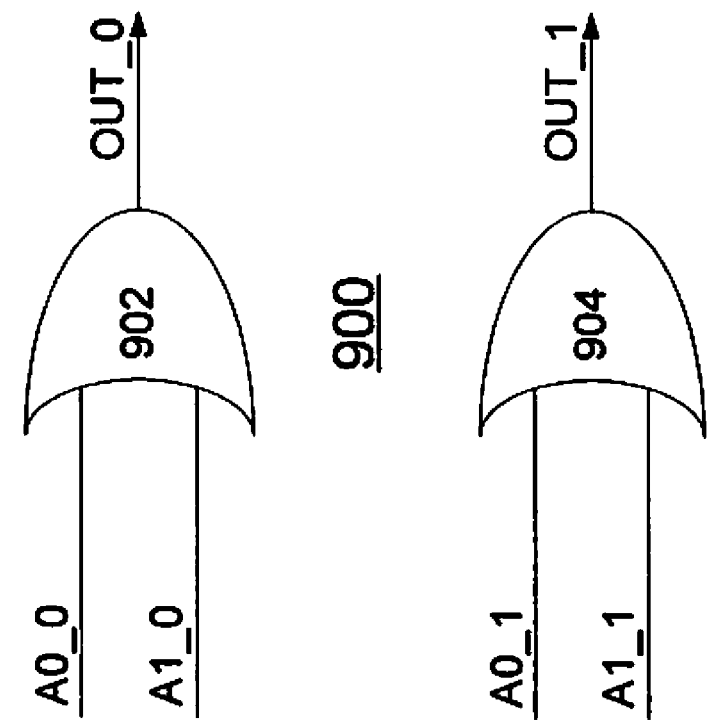
FIG. 9 is a schematic diagram of dual OR logic gate, D_OR2 each having duplicated inputs and duplicated outputs, of the exemplary radiation hardened phase frequency detector (PFD) of FIG. 7 implemented in accordance with a method of the preferred embodiment.

Referring now to FIG. 9, there are shown dual OR logic gates generally designated by the reference character 900 implemented in accordance with a method of the preferred embodiment. A pair of OR logic gates 902, 904 of the dual OR logic gates 900 has duplicated inputs and outputs; there is an example of implementing dual OR gates 710, 712 of the exemplary radiation hardened phase frequency detector (PFD) 700. Inputs A0_0, A1_0 are applied to OR logic gate 902 and duplicated inputs A0_1, A1_1 are applied to OR logic gate 904. OR logic gate 902 provides output OUT_0 and OR logic gate 904 provides duplicated output OUT_1.

Figure 10:
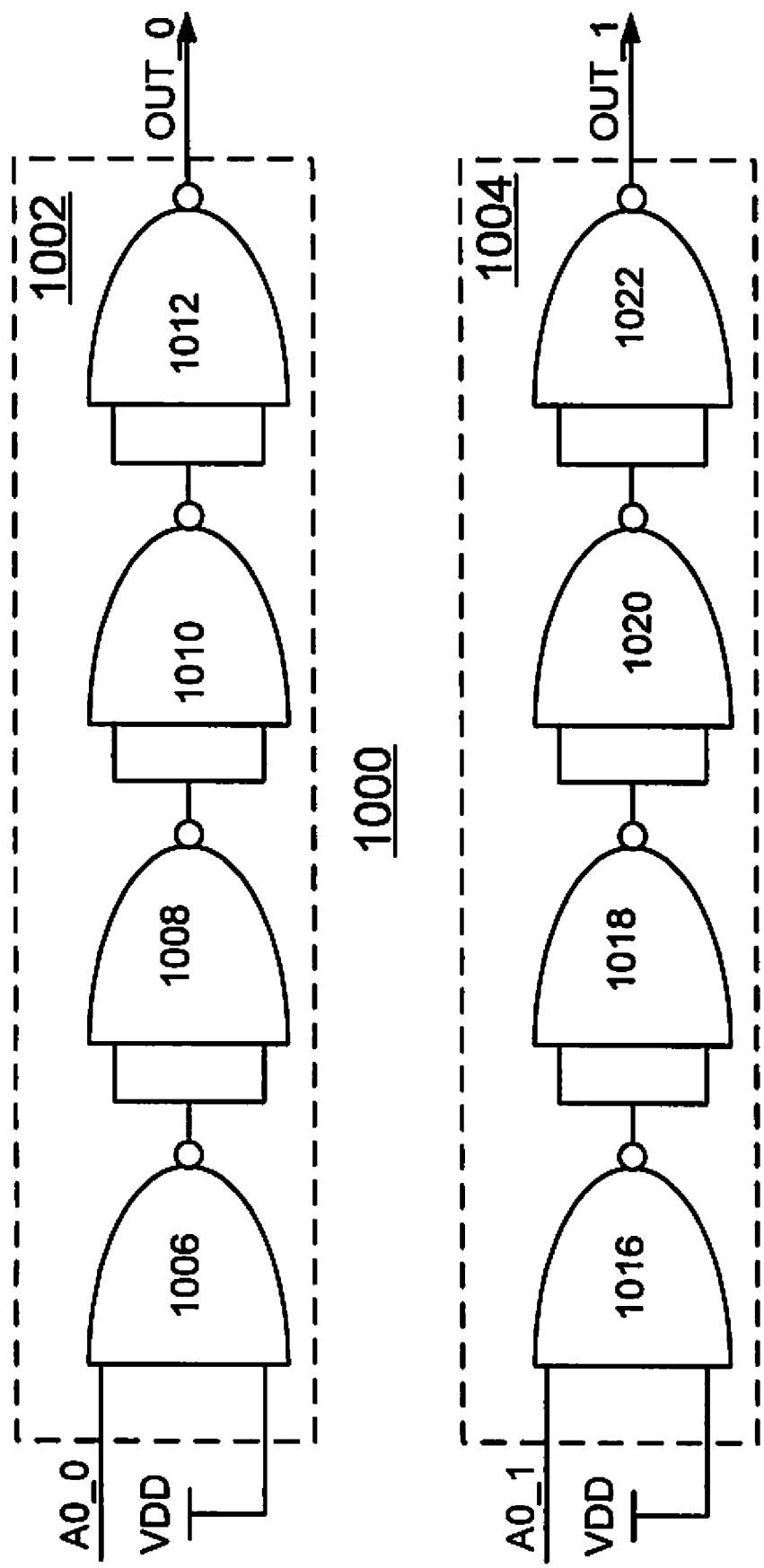
FIG. 10 is a schematic diagram of dual delay line logic gate, D_DLY each having duplicated inputs and duplicated outputs, of the exemplary radiation hardened phase frequency detector (PFD) of FIG. 7 implemented in accordance with a method of the preferred embodiment.

Referring now to FIG. 10, there are shown dual delay line logic gates 30 generally designated by the reference character 1000 implemented in accordance with a method of the preferred embodiment. A pair of delay lines 1002, 1004 has duplicated inputs and outputs, for example, for implementing dual delay lines 716 of the exemplary radiation hardened phase frequency detector (PFD) 700. Delay line 1002 provides output OUT_0 and includes a plurality of series connected NAND gates 1006, 1008, 1010, 1012 with inputs A0_0, VDD applied to the first NAND gate 1006. Delay line 1004 provides duplicated output OUT_1 and includes a plurality of series connected NAND gates 1016, 1018, 1020, 1022 with duplicated inputs A0_1, VDD applied to the first NAND gate 1016.

Figure 11:
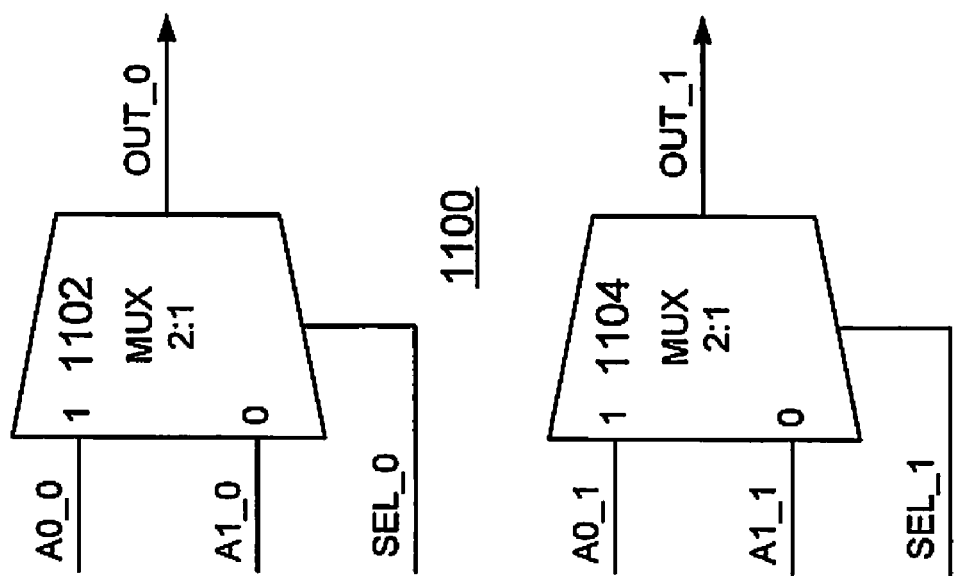
FIG. 11 is a schematic diagram of dual multiplexers logic gate, D_MUX21 each having duplicated inputs and duplicated outputs, of the exemplary radiation hardened phase frequency detector (PFD) of FIG. 7 implemented in accordance with a method of the preferred embodiment.

Referring now to FIG. 11, there are shown dual multiplexers logic gates generally designated by the reference character 1100 implemented in accordance with a method of the preferred embodiment. A pair of multiplexers 1102, 1104 has duplicated inputs and outputs, for example, for implementing dual multiplexers 718 of the exemplary radiation hardened phase frequency detector (PFD) 700. Multiplexers 1102, 1104 are 2:1 multiplexers respectively providing duplicated outputs OUT_0, OUT_1. Inputs A0_0, A1_0 and SEL_0 are applied to multiplexer 1102 and duplicated inputs A0_1, A1_1 and SEL_1 are applied to multiplexer 1104. The outputs OUT_0, OUT_1 are represented by:

$$\mathrm{OUT}\_i = A0\_i * \mathrm{SEL}\_i + A1\_i * \mathrm{SEL}\_i, i=0,1$$

Simulation test results have confirmed that radiation hardened phase frequency detector (PFD) 700 is solid and robust. The illustrated logic gates as illustrated and described with respect to FIGS. 8, 9, 10 and 11 provide fundamental techniques for radiation hardened combinational and sequential logic arrangements. Hence, any of the system logics configured in accordance with the illustrated fundamental techniques for radiation hardened combinational and sequential logic arrangements advantageously are mitigated with these techniques. Additionally, the illustrated latches 100, 400, radiation hardened phase frequency detector (PFD) 700 and logic gates as illustrated and described with respect to FIGS. 8, 9, 10 and 11 are independent of CMOS technologies; therefore, can be used for the future generation system logics.

While the present invention has been described with reference to the details of the embodiments of the invention shown in the drawing, these details are not intended to limit the scope of the invention as claimed in the appended claims.

What is claimed is:

1. A radiation hardened phase frequency detector (PFD) for implementing enhanced radiation immunity performance comprising:

a plurality of functional blocks; each said functional block including duplicated components providing duplicated inputs, and duplicated outputs;

said plurality of functional blocks including a plurality of radiation hardened latches, each radiation hardened latch including said duplicated components providing said duplicated inputs, and said duplicated outputs;

said plurality of functional blocks including a plurality of logic gates, each logic gate including duplicated inputs, and duplicated outputs; said plurality of logic gates including dual multiplexers;

said plurality of radiation hardened latches including a first pair of said radiation hardened latches coupled to respective logic gates and a second pair of said radiation hardened latches;

each said first pair of radiation hardened latches receiving identical PFD input signals and providing duplicated output signals;

each said second pair of said radiation hardened latches receiving duplicated output signals of a respective one of said first pair of radiation hardened latches, and respectively providing duplicated PFD increment output signals and duplicated PFD decrement output signals; and said duplicated components being arranged for a single event upset (SEU) hit to one node, a duplicated node supporting the functionalities of the phase frequency detector (PFD).

2. A radiation hardened phase frequency detector (PFD) as recited in claim 1 wherein each said radiation hardened latch includes a plurality of NAND NMOS pull down logic gates, and a plurality of NAND PMOS pull up logic gates.

3. A radiation hardened phase frequency detector (PFD) as recited in claim 2 wherein both said plurality of NAND NMOS pull down logic gates and said plurality of NAND PMOS pull up logic gates receive respective duplicated inputs, and provide respective duplicated outputs.

4. A radiation hardened phase frequency detector (PFD) as recited in claim 3 wherein said plurality of NAND NMOS pull down logic gates include a plurality of N-channel field effect transistors (NFETs) connected in series between a respective duplicated output and ground.

5. A radiation hardened phase frequency detector (PFD) as recited in claim 4 wherein said plurality of NAND PMOS pull up logic gates include a plurality of P-channel field effect transistors (PFETs) connected between a voltage supply rail and a respective duplicated output.

6. A radiation hardened phase frequency detector (PFD) as recited in claim 5 wherein said PFETs and said NFETs have a selected ratio, said selected ratio provided to ensure only one of said duplicated inputs, and said duplicated outputs is pulled up or down after a single event upset (SEU) hit.

7. A radiation hardened phase frequency detector (PFD) as recited in claim 1 wherein said plurality of logic gates include dual NAND gates.

8. A radiation hardened phase frequency detector (PFD) as recited in claim 1 wherein said plurality of logic gates include dual OR gates.

9. A radiation hardened phase frequency detector (PFD) as recited in claim 1 wherein said plurality of logic gates include dual delay lines.

* * * * *